(12) United States Patent
Dang et al.

(10) Patent No.: US 7,489,584 B2
(45) Date of Patent: Feb. 10, 2009

(54) HIGH PERFORMANCE, LOW-LEAKAGE STATIC RANDOM ACCESS MEMORY (SRAM)

(75) Inventors: Luan A. Dang, Richardson, TX (US); Hiep Van Tran, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/126,644

(22) Filed: May 11, 2005

(65) Prior Publication Data

US 2006/0268648 A1   Nov. 30, 2006

(51) Int. Cl.
*G11C 8/00* (2006.01)
(52) U.S. Cl. .............................. 365/230.03; 365/230.06; 365/226
(58) Field of Classification Search ................. 365/227, 365/229, 230.03, 230.06, 226, 189.09, 154, 365/156
See application file for complete search history.

(56) References Cited

U.S. PATENT DOCUMENTS

| | | | | |
|---|---|---|---|---|
| 3,573,757 A | * | 4/1971 | Adams ........................ | 365/163 |
| 5,587,958 A | * | 12/1996 | Kaneko et al. ......... | 365/230.06 |
| 5,615,162 A | | 3/1997 | Houston | |
| 5,666,324 A | * | 9/1997 | Kosugi et al. ............... | 365/233 |
| 5,969,995 A | | 10/1999 | Morishima | |
| 5,991,191 A | * | 11/1999 | Rao ............................ | 365/154 |
| 6,111,779 A | * | 8/2000 | You ............................ | 365/154 |
| 6,850,454 B2 | * | 2/2005 | Kuge et al. ................. | 365/227 |
| 6,940,754 B2 | * | 9/2005 | Umezawa .............. | 365/185.09 |
| 7,023,761 B1 | * | 4/2006 | Tran ........................... | 365/233 |
| 7,092,307 B2 | * | 8/2006 | Chen et al. .................. | 365/226 |

* cited by examiner

*Primary Examiner*—Gene N. Auduong
(74) *Attorney, Agent, or Firm*—Ronald O. Neerings; Wade James Brady, Jr.; Frederick J. Telecky, Jr.

(57) ABSTRACT

Systems and methods are provided for reducing leakage current and maintaining high performance in a static random access memory (SRAM). One embodiment discloses a memory array system operative to store data bits in individually addressable rows and columns. The memory array system comprises a plurality of memory blocks, each of the plurality of memory blocks having a plurality of memory rows and a row peripheral circuit operative to switch a memory block from a retention mode to an activation mode in response to an addressing of a memory row within the memory block.

29 Claims, 3 Drawing Sheets

HIGH PERFORMANCE, LOW-LEAKAGE STATIC RANDOM ACCESS MEMORY (SRAM)

TECHNICAL FIELD

This invention relates to electronic circuits, and more specifically to reducing leakage current while maintaining high performance in a static random access memory (SRAM).

BACKGROUND

Static random access memory (SRAM) is a type of RAM that uses transistor driven data cells to latch bits of data for memory storage and is used in a large variety of consumer electronics, such as computers and cellular telephones. Data cells in a SRAM circuit are typically arranged in an array, such that the SRAM includes individually addressable rows and columns to which data can be written and from which data can be read. The individually addressable rows and columns are controlled by peripheral circuitry that receives decoded signals corresponding to memory locations, which could be generated from a processor, such that the peripheral circuitry determines which of the data cells in the array are written to and read from at any given time. While data is being transferred to and from a SRAM circuit, the SRAM is considered to be in an activation mode, such that all of the data cells in the array are receiving power and are capable of freely allowing data transfer to and from the data cells.

The market for consumer electronics, however, is constantly improving. There is an increasing demand for smaller circuit packages that consume less power for the purpose of conserving battery-life, such as in wireless communication applications. One attempt to achieve lower power consumption is to switch the SRAM from an active mode to a retention mode of operation at times when data is not being written to or read from the memory array. To retain the data written into the SRAM memory array, the memory array needs a continuous power supply. In the retention mode of operation, power is continuously supplied to the SRAM, but the power supplied to the SRAM is reduced, resulting in lower power consumption in the form of leakage current. However, excess power consumption due to leakage current becomes particularly problematic as SRAM transistor gate-oxide sizes shrink (e.g., 70 nm or smaller), even when the SRAM is in the retention mode. Additionally, accessing data from a SRAM memory array that is in the retention mode impacts system performance due to the amount of time that it takes for the power to be increased to switch the SRAM to the activation mode to allow data read and write operations.

SUMMARY

One embodiment of the present invention discloses a memory array system operative to store data bits in individually addressable rows and columns. The memory array system comprises a plurality of memory blocks, each of the plurality of memory blocks having a plurality of memory rows and a row peripheral circuit operative to switch a memory block from a retention mode to an activation mode in response to an addressing of a memory row within the memory block.

Another embodiment of the present invention discloses a method for reducing leakage current and maintaining high performance in a memory array system comprising grouping a plurality of memory rows into a plurality of memory blocks and addressing a memory row for data read/write access. The method also comprises switching a memory block that includes the memory row from a retention mode to an activation mode in response to addressing the memory row.

Yet another embodiment of the present invention discloses a mobile communication device comprising an antenna for transmitting and receiving wireless signals, a transceiver, and a memory array system. The memory array system comprises a plurality of memory blocks, each of the plurality of memory blocks having a plurality of memory rows and a row peripheral circuit operative to switch a memory block from a retention mode to an activation mode in response to an addressing of a memory row within the memory block.

DETAILED DESCRIPTION

The present invention relates to electronic circuits, and more specifically to reducing leakage current while maintaining high performance in a static random access memory (SRAM). A memory array system includes a number of memory blocks, with each of the memory blocks having a number of individually addressable memory rows, and a row peripheral circuit. The row peripheral circuit is operative to switch a memory block from a "retention mode" to an "activation mode" in response to an addressing of a memory row within the memory block. Power remains on the SRAM to avoid excessive power-up time, thus ensuring that the SRAM is capable of high-performance when reading and writing data. At any given time, one of the memory blocks is in the activation mode, such that it receives full power and is capable of reading and writing data. The remaining memory blocks are kept in the retention mode, such that they receive a reduced amount of power to mitigate leakage current, but still receive enough power to retain stored data. The memory block that is in the activation mode is determined by which memory row is being addressed for reading and writing at any given time by peripheral circuitry. For example, a decode signal is sent to the peripheral circuitry to specify a specific memory row for data read/write access. The same decode signal may be used to specify that the memory block which includes the specific memory row is to be switched to the activation mode, while the remaining memory blocks remain in the retention mode. As another example, the peripheral circuitry could assert a row activation signal to specify the specific memory row for data read/write access, and the memory block which includes the specific memory row could be switched to the activation mode in response to the assertion of the row activation signal.

Figure 1:
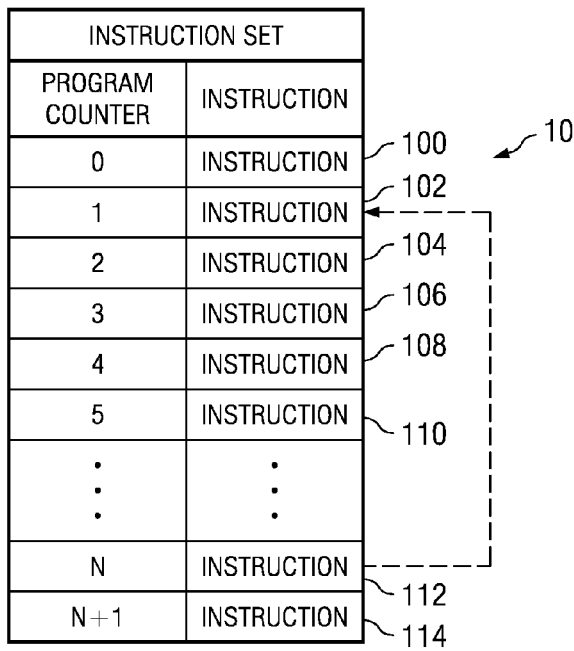
FIG. 1 illustrates a block diagram of a static random access memory (SRAM) circuit in accordance with an aspect of the invention.

FIG. 1 illustrates a block diagram of a SRAM circuit 10 in accordance with an aspect of the invention. The SRAM 10 includes a memory array 12 that has a large number of data cells, each corresponding to a single bit, that are organized by rows and columns. For example, the memory array 12 could be organized into 2 k (2048) memory rows and 1k (1024) memory columns. The SRAM 10 also includes a row address decode circuit 14 that is coupled to a row peripheral circuit 16. The row address decode circuit 14 receives a row address signal, such as from a processor (not shown), that can be a digital signal corresponding to a row portion of a memory address in the memory array 12 of the SRAM 10. The row address decode circuit 14 decodes the signal and outputs a row decode signal 18 to the row peripheral circuit 16. The row peripheral circuit 16 receives the row decode signal and outputs a row activation signal. The row activation signal activates the appropriate memory row corresponding to the row decode signal 18 for read and write access to the memory cells in that memory row. It is to be understood that the row address decode circuit 14 could be included within the row peripheral circuit 16, such that the row address signal is decoded within the row peripheral circuit 16 to produce the row activation signal.

The SRAM 10 also includes a column address decode circuit 20 that is coupled to a column peripheral circuit 22. The column address decode circuit 20 receives a column address signal, such as from a processor (not shown), that can be a digital signal corresponding to a number of column portions of a memory address in the memory array 12 of the SRAM 10. The column address decode circuit 20 decodes the signal and outputs a column decode signal to the column peripheral circuit 22. The column peripheral circuit 22 receives the column decode signal and activates the appropriate memory columns corresponding to the column decode signal for read and write access to the memory cells in those memory columns. Therefore, the row peripheral circuit 16 and the column peripheral circuit 22, in combination, allow bits of data to be written to and read from specific memory cells corresponding to the rows and columns that are addressed in the row address signal and the column address signal.

In accordance with an aspect of the invention, the memory array 12 can be divided into a number N of memory blocks 24, N being an integer greater than one, with each memory block 24 including a number of memory rows. For example, for a memory array 12 that has 2 k memory rows, as described above, the memory array 12 could include 64 memory blocks 24 with each memory block 24 including 32 memory rows. At a given time, one of the N memory blocks 24 is in the activation mode, such that it receives the full power (e.g., the required voltage) to allow data bits to be written to and read from the data cells in the memory rows that are included in the memory block 24. The specific memory block 24 that is in the activation mode at a given time is determined by the memory row that is being addressed for data read/write operations. For example, a specific memory block 24 is switched to the activation mode in response to a memory row that is included within the specific memory block 24 being addressed for data read/write operations. While one of the memory blocks 24 is in the activation mode, the remaining memory blocks 24 remain in the retention mode, such that they are still capable of storing data, but they are kept at a reduced power level (e.g., a lower voltage) so as to reduce power consumption by reducing leakage current.

In the example of FIG. 1, each of the memory blocks 24 also receives the row decode signal 18 output from the row address decode circuit 14. The specific memory block 24 that is in the activation mode at any given time could be determined by the row decode signal 18. For example, at a given time, the row decode signal 18 could designate a given one of the memory rows in Memory Block 1 for data to be read from and written to. Concurrently, the row decode signal 18 also designates Memory Block 1 to be in the activation mode. The remaining memory blocks 24 remain in the retention mode because none of the memory rows included in the remaining memory blocks 24 are being addressed for data read/write access. Memory Block 1 remains in the activation mode, even after data is no longer being read from or written to the given one of the memory rows in Memory Block 1. The row address decode circuit 14 could output a different row decode signal 18 that corresponds to a different one of the memory rows in Memory Block 1, in which case Memory Block 1 remains in the activation mode.

Upon the row address decode circuit 14 outputting a signal corresponding to one of the memory rows in Memory Block 2, Memory Block 2 is switched to the activation mode. The voltage potential of all of the memory rows in Memory Block 2 is raised to an acceptable level for allowing data to be written to and read from any of the data rows that are included in Memory Block 2. In addition, because none of the memory rows within Memory Block 1 are being addressed, Memory Block 1 is switched to the retention mode. Accordingly, the voltage potential of all of the memory rows in Memory Block 1 is reduced to mitigate power loss from leakage current. Memory Block 2 now remains in the activation mode, allowing data to be written to and read from any of the data rows that comprise Memory Block 2, until the row address decode circuit 14 outputs a row decode signal 18 that corresponds to a memory row in a different one of the memory blocks 24.

It is to be understood that, in addition to reducing the voltage potential of a memory block 24, there are other ways in which leakage current in a SRAM can be reduced for memory blocks 24 that are in retention mode. For example, the row peripheral circuit 16 can also consume power through leakage current. Accordingly, leakage current can be reduced by removing power altogether from the portions of the row peripheral circuit 16 that correspond to the memory blocks 24 that are in the retention mode, for example, by removing a positive voltage rail using a switch.

The row decode signal 18 thus controls which of the memory blocks 24 is in the activation mode while the remaining memory blocks 24 remain in the retention mode. Accordingly, the SRAM 10 has a significantly reduced power loss resulting from leakage current because a large portion of the memory array 12 is kept in the retention mode, such that the voltage potential of that large portion of the memory array 12 is reduced. However, at a given time, one of the memory blocks 24 is capable of having data written to and read from it, such that the SRAM 10 maintains high performance. Additionally, the switching between the activation mode and the retention mode of the memory blocks 24 is transparent to a user or a system that includes the SRAM 10 because the switching between the activation mode and the retention mode of the memory blocks 24 results from the row decode signal 18, and not other dedicated processor based memory control signals. Therefore, power and system resources are conserved.

It is to be understood that, in accordance with an aspect of the invention, there can be alternatives to the example of FIG. 1 for providing a low-leakage, high-performance SRAM. For example, memory blocks need not be limited to groups of memory rows, but could also be grouped by memory columns. Additionally, more than one memory block could be switched to the activation mode at any given time in response to the addressing of a given row or multiple rows while the remaining memory blocks are kept in the retention mode. Also, there is no upper or lower limit to the number of memory rows that can be included in a single memory block, in accordance with an aspect of the invention. For example, there can be as few as two memory blocks, such that half of the memory rows in the memory array, such as 1k in the above example, are included in each of the two memory blocks. Alternatively, each of the memory rows can be an independent memory block, such that there are as many memory blocks as there are memory rows. In addition, as another example, the sizes of the memory blocks with regard to the number of memory rows within each memory block need not be uniform. As yet another example, a given memory block could be switched from the retention mode to the activation mode in response to the assertion of a row activation signal to activate a memory row that is included within the given memory block, instead of switching the given memory block using the row decode signal.

Figure 2:
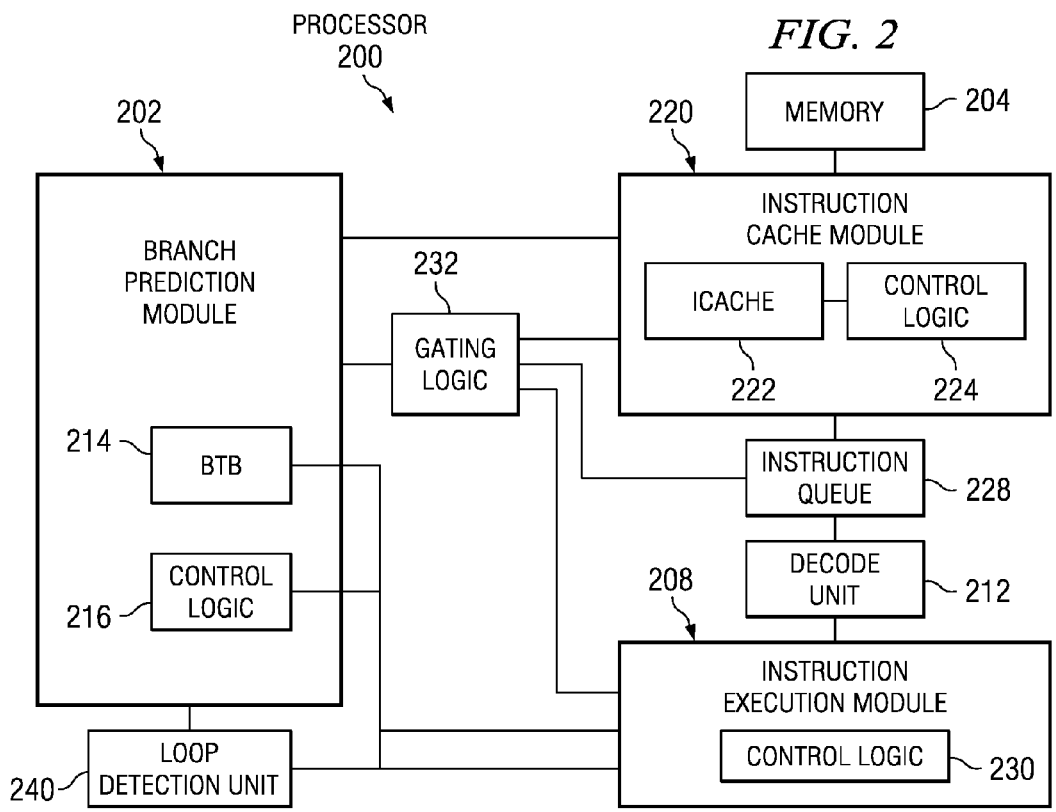
FIG. 2 illustrates a memory block of a SRAM circuit in accordance with an aspect of the invention.

FIG. 2 illustrates an example of a system 50 that is a portion of a SRAM. The system 50 includes a memory block 52, such as one of the N memory blocks 24 in the example of FIG. 1. The memory block 52 includes a number of memory rows 54, illustrated in the example of FIG. 2 as 32 (e.g., numbering 0-31). Each of the memory rows 54 includes a number of memory cells 56. Each memory cell is capable of storing one bit of data. The memory cells 56 are individually addressed within a memory row 54 by a number of column signals (not shown) corresponding to the number of memory cells 56 within a given memory row 54.

The system 50 also includes a portion of the peripheral circuit 58. The portion of the peripheral circuit 58 is a portion that corresponds specifically to the memory block 52, such that the portion of the peripheral circuit 58 activates the specific memory rows 54 that are included in the memory block 52. The portion of the peripheral circuit 58 activates the specific memory rows 54 by receiving a row decode signal 60, such as could be sent by the row address decode circuit 14 in the example of FIG. 1. The portion of the peripheral circuit 58 could decode the row decode signal 60 to generate one of 32 row activation signals 62 to activate a corresponding one of the memory rows 54.

The memory block 52 also includes a mode switch 64. The mode switch 64 receives the row decode signal 60 and determines if the row decode signal 60 corresponds to one of the memory rows 54 of the memory block 52. For example, the mode switch 64 could decode the row decode signal 60 to determine if the row decode signal 60 corresponds to one of the memory rows 54 of the memory block 52. If the row decode signal 60 corresponds to one of the memory rows 54 of the memory block 52, the mode switch 64 asserts (e.g., logic 1) a signal $SW_{ACT}$ in response, thus switching the memory block 52 to the activation mode. The signal $SW_{ACT}$ is received as an input to an inverter 66, which outputs a signal $SW_{RET}$ that is the inverse of the signal $SW_{ACT}$, such that the signals $SW_{ACT}$ and $SW_{RET}$ are mutually exclusive. If the row decode signal 60 does not correspond to one of the memory rows 54 of the memory block 52, the mode switch 64 de-asserts (e.g., logic 0) the signal $SW_{ACT}$ in response, thus asserting the signal $SW_{RET}$ and switching the memory block 52 to the retention mode.

The memory block 52 also includes a positive voltage rail 68 and a negative voltage rail 69, which collectively represent the voltage potential available at each of the memory cells 56. The signals $SW_{ACT}$ and $SW_{RET}$ are used by the memory block 52 to adjust the voltage potential of the positive voltage rail 68 and the negative voltage rail 69 in response to being switched to the activation mode or the retention mode. In the example of FIG. 2, the signal $SW_{ACT}$ is coupled to a gate terminal of an N-type MOS transistors N1 and a P-type MOS transistor P2. The transistor P2 is interconnected between a positive supply voltage $V_{DD\_RET}$, the positive supply voltage $V_{DD\_RET}$ being associated with the retention mode, and the positive voltage rail 68. The transistor N1 is interconnected between the negative voltage rail 69 and ground. The signal $SW_{RET}$ is coupled to a gate terminal of an N-type MOS transistors N2 and a P-type MOS transistor P1. The transistor P1 is interconnected between a positive supply voltage $V_{DD\_ACT}$, the positive supply voltage $V_{DD\_ACT}$ being associated with the activation mode, and the positive voltage rail 68. The transistor N2 is interconnected between the negative voltage rail 69 and a negative supply voltage $V_{SS\_RET}$, the negative supply voltage $V_{SS\_RET}$ being associated with the retention mode. The positive supply voltage $V_{DD\_ACT}$ has a voltage potential that is greater than the positive supply voltage $V_{DD\_RET}$, and the negative supply voltage $V_{SS\_RET}$ has a voltage potential that is greater than ground. For example, the positive supply voltage $V_{DD\_ACT}$ could equal approximately 1.8V, the positive supply voltage $V_{DD\_RET}$ could equal approximately 1.3V, and the negative supply voltage $V_{SS\_RET}$ could equal approximately 0.6V.

Upon the signal $SW_{ACT}$ being asserted, the signal $SW_{RET}$ becomes de-asserted, and the memory block 52 is switched to the activation mode. The transistors P1 and N1 each activate, thus coupling the positive voltage rail 68 to the positive supply voltage $V_{DD\_ACT}$ and the negative voltage rail 69 to ground. Therefore, each of the memory cells receives an activation mode voltage potential of $V_{DD\_ACT}$ relative to ground. Upon the signal $SW_{ACT}$ being de-asserted, the signal $SW_{RET}$ becomes asserted, and the memory block 52 is switched to the retention mode. The transistors P2 and N2 each activate, thus coupling the positive voltage rail 68 to the positive supply voltage $V_{DD\_RET}$ and the negative voltage rail 69 to the negative supply voltage $V_{SS\_RET}$. Therefore, each of the memory cells receives a retention mode voltage potential of $V_{DD\_RET}$ relative to $V_{SS\_RET}$. The retention mode voltage potential is less than the activation mode voltage potential, such that the retention mode voltage potential is sufficient for storing data bits in the memory cells 56, but insufficient for reading data from and writing data to the memory cells 56.

It is to be understood that the mode switch 64 is but one example of how to switch the memory block 52 between the activation mode and the retention mode. Other ways to switch the memory block 52 between the activation mode and the retention mode based on the row decode signal 60 can also be realized in accordance with an aspect of the invention. For example, the mode switch 64 could be included in the portion of the peripheral circuit 58 instead of in the memory block 52, such that the row decode signal 60 is only decoded within the portion of the peripheral circuit 58. As another example, there could be only one mode switch corresponding to an entire SRAM, such that the one mode switch could have as many outputs as there are memory blocks in the memory array. As yet another example, the mode switch 64 could receive each of the row activation signals 62 as an input, such as to an OR gate within the mode switch 64, such that the signal $SW_{ACT}$ becomes asserted in response to one of the row activation signals 62 becoming asserted.

Figure 3:
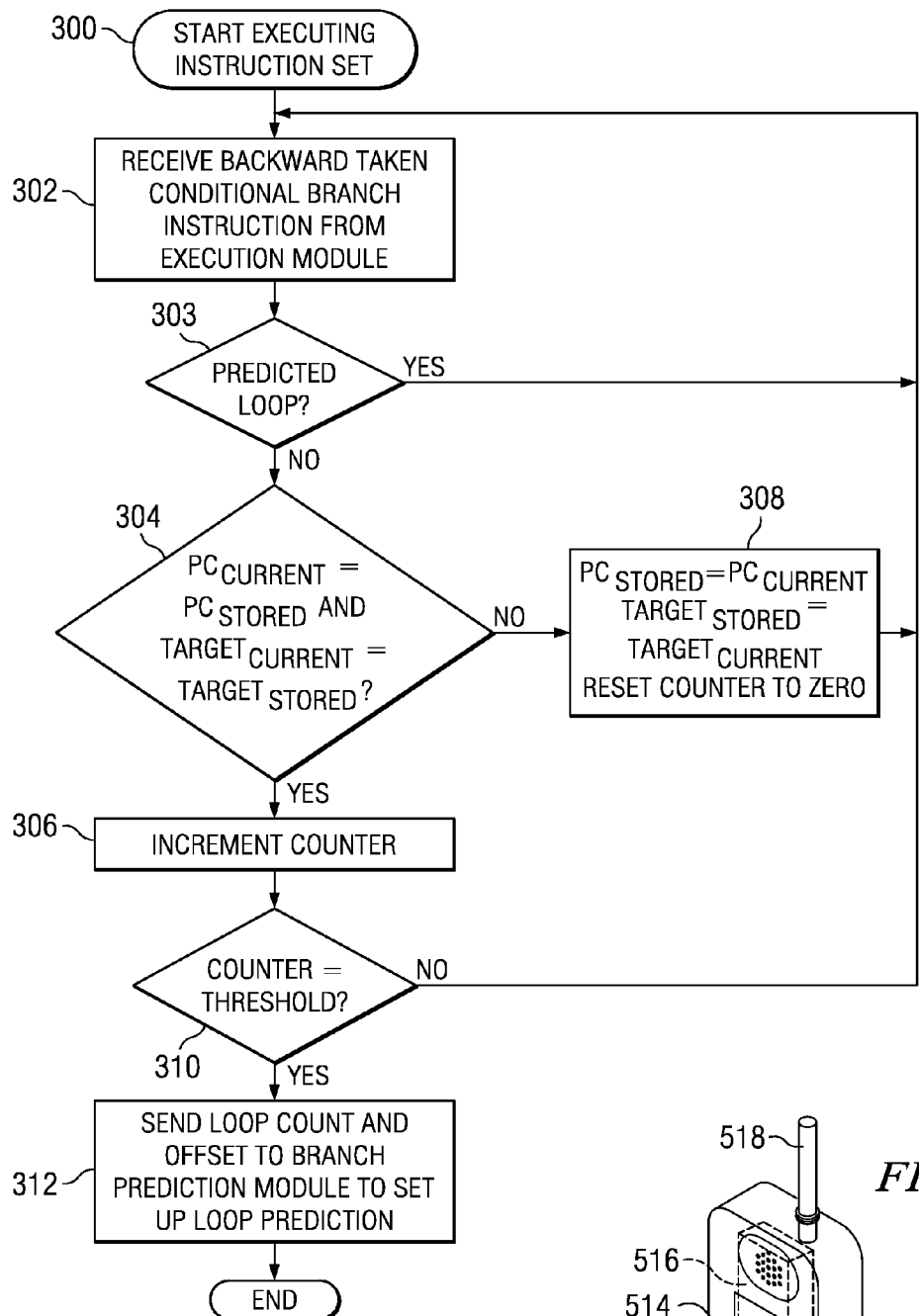
FIG. 3 illustrates a memory cell circuit with corresponding peripheral circuitry in accordance with an aspect of the invention.

FIG. 3 illustrates an example of a circuit 100, including a memory cell 102 and an associated row circuit 104, in accordance with an aspect of the invention. It is to be understood that the circuit 100 is an example of a small portion of a SRAM, such that the memory cell 102 can be one of 2 k (2048) memory cells in a single memory column and one of 1 k (1024) memory cells in a single memory row of a memory array, as described above in the example of FIG. 1. Further, the row circuit 104 is a small portion of a row peripheral circuit, such as the row peripheral circuit 16 described above in the example of FIG. 1, such that the row circuit 104 can be one of 2 k (2048) row circuits in a row peripheral circuit of a SRAM.

The row circuit 104 includes a P-type MOS transistor P3 and an N-type transistor N3. The transistors P3 and N3 each have a gate terminal connected together and a drain terminal connected together, such that the transistors P3 and N3 are arranged as an inverter 108. The gate terminals of the transistors P3 and N3 are also connected to a row driver components circuit 106. The row driver components circuit 106 contains control circuitry to enable or disable reading data from and writing data to the memory cell 102.

The inverter 108 has an inverter output 110 that is the common connection of the drain terminals of the transistors P3 and N3. The inverter output 110 is connected to gate terminals of N-type MOS transistors N4 and N5 within the memory cell 102. The transistor N4 has a source terminal that is connected to a signal DATA and the transistor N5 has a source terminal that is connected to a signal DATA'. The transistors N4 and N5 each have a drain terminal that is connected to a latch 112, which includes N-type MOS transistors N6 and N7 and P-type MOS transistors P4 and P5. The latch 112 is interconnected between a positive voltage rail 114 and a negative voltage rail 116, with the positive voltage rail 114 being connected to a source terminal of each of the transistors P4 and P5, and the negative voltage rail 116 being connected to a drain terminal of each of the transistors N6 and N7. The positive voltage rail 114 and the negative voltage rail 116 collectively are the power supply to the memory cell 102.

The transistors N4 and N5 behave as data access transistors for the memory cell 102. In the example of FIG. 3, when the inverter output 110 is asserted, the transistors N4 and N5 become activated. The signals DATA and DATA' thus become coupled to the latch 112, allowing a data bit to be read from or written to the latch 112. This operation occurs when the memory block that includes the memory cell 102 is in the activation mode. The inverter output 110 can be de-asserted during the activation mode if the memory cell 102 is not being addressed for data read/write access. If the memory block that includes the memory cell 102 is in the retention mode, then a data bit can still remain stored in the latch 112. The transistors N6, N7, P4, and P5 produce a leakage current while the data bit is stored in the latch 112, and such a leakage current can result in a significant power loss for a SRAM that includes over one million memory cells, such as the memory cell 102. However, the transistors N6, N7, P4, and P5 need not operate at a full voltage potential to continue to store a data bit in the latch.

The circuit 100 also includes P-type MOS transistors P6 and P7, and N-type MOS transistors N8 and N9. The transistor P6 has a gate terminal connected to a signal $SW_{ACT}$, which could be asserted while the memory block that includes the memory cell 102 is in the activation mode, such as the signal $SW_{ACT}$ described above in the example of FIG. 2. The transistor P6 also has a drain terminal that is connected to the positive voltage rail 114 and a source terminal that is connected to a positive supply voltage $V_{DD\_RET}$ (e.g., approximately 1.3V), which is a retention mode positive supply voltage, such as described above in the example of FIG. 2. The transistor P7 has a gate terminal connected to a signal $SW_{RET}$, which could be asserted while the memory block that includes the memory cell 102 is in the retention mode, such as the signal $SW_{RET}$ described above in the example of FIG. 2. The transistor P7 also has a drain terminal that is connected to the positive voltage rail 114 and a source terminal that is connected to a positive supply voltage $V_{DD\_ACT}$ (e.g., approximately 1.8V), which is an activation mode positive supply voltage, such as described above in the example of FIG. 2. The transistor N8 has a gate terminal connected to the signal $SW_{ACT}$, a drain terminal that is connected to the negative voltage rail 116, and a source terminal that is connected to a negative supply voltage, illustrated in the example of FIG. 3 as ground. The transistor N9 has a gate terminal connected to the signal $SW_{RET}$, a drain terminal that is connected to the negative voltage rail 116, and a source terminal that is connected to a negative supply voltage $V_{SS\_RET}$ (e.g., approximately 0.6V), which is a retention mode negative supply voltage, such as described above in the example of FIG. 2.

Upon the memory block that includes the memory cell 102 being switched to the activation mode, the signal $SW_{ACT}$ becomes asserted. Accordingly, the signal $SW_{RET}$ becomes de-asserted because the signal $SW_{ACT}$ corresponding to the activation mode and the signal $SW_{RET}$ corresponding to the retention mode are mutually exclusive, as described above in the example of FIG. 2. Therefore, the transistors P7 and N8 become activated. The voltage potential at the positive voltage rail 114 thus becomes equal to the positive supply voltage $V_{DD\_ACT}$ and the voltage potential at the negative voltage rail 116 becomes equal to ground. Thus, the latch 112 of the memory cell 102 receives an activation mode voltage potential of $V_{DD\_ACT}$ relative to ground (e.g., approximately 1.8V).

Upon the memory block that includes the memory cell 102 being switched to the retention mode, the signal $SW_{RET}$ becomes asserted. Accordingly, the signal $SW_{ACT}$ becomes de-asserted. Therefore, the transistors P7 and N8 become deactivated and the transistors P6 and N9 become activated. The voltage potential at the positive voltage rail 114 thus becomes equal to the positive supply voltage $V_{DD\_RET}$ and the voltage potential at the negative voltage rail 116 becomes equal to the negative supply voltage $V_{SS\_RET}$. Thus, the latch 112 of the memory cell 102 receives retention mode voltage potential of $V_{DD\_RET}$ relative to $V_{SS\_RET}$ (e.g., approximately 0.7V). As described above in the example of FIG. 2, the positive supply voltage $V_{DD\_ACT}$ may be greater than positive supply voltage $V_{DD\_RET}$, and the negative supply voltage $V_{SS\_RET}$ may be greater than ground. The voltage potential of the latch 112 of the memory cell 102 in the retention mode is thus less than it is in the activation mode. Therefore, leakage current in the transistors N6, N7, P4, and P5 can be significantly reduced in the retention mode while a data bit remains stored in the latch 112.

In addition to the transistors N6, N7, P4, and P5 producing leakage current while the memory block that includes the memory cell 102 is in the retention mode, the transistors P3 and N3 in the row circuit 104 may also produce an undesired leakage current. Accordingly, a source terminal of the transistor P3 is connected to a drain terminal of a P-type MOS transistor P8. The transistor P8 has a gate terminal that is connected to the signal $SW_{RET}$ and a source terminal that is connected to the positive supply voltage $V_{DD\_ACT}$. Therefore, when the signal $SW_{ACT}$ is asserted, the signal $SW_{RET}$ is de-asserted, signifying that the memory block that includes the memory cell 102 is in the activation mode. The transistor P8 is thus activated and the inverter 108 receives power from the positive supply voltage $V_{DD\_ACT}$, such that the inverter 108 can operate properly to activate the memory cell 102 for data read/write access. However, when the signal $SW_{ACT}$ is de-asserted, the signal $SW_{RET}$ is asserted, signifying that the memory block that includes the memory cell 102 is in the retention mode. The transistor P8 is thus deactivated, removing power to the inverter 108, such that the inverter 108 is disabled. As the memory block that includes the memory cell 102 is in the retention mode, there is no need to activate the memory cell for data read/write access. Accordingly, by deactivating the inverter 108 of the row circuit 104, leakage current can be further reduced while the memory block that includes the memory cell 102 is in the retention mode. It is to be understood that, although the example of FIG. 3 demonstrates that the transistor P8 activates the inverter 108 for a single row, the transistor P8 could instead be associated with every row in a single memory block. Thus, an entire portion of the row peripheral circuit could be activated in the activation mode and deactivated in the retention mode by the operation of one or more switches.

Leakage current produced by the PMOS transistors in the memory cell can be even further reduced by the way in which they are configured in the circuit. For example, the transistors P3, P4, and P5 are each configured with an N-well in the body of the transistors that could be used to supply a voltage to a bulk terminal on the transistors. In the example of FIG. 3, the transistors P3, P4, and P5 each have a bulk terminal that is connected to a positive supply voltage $V_{DD\_NWL}$ that could be greater than the positive supply voltage $V_{DD\_ACT}$. Accordingly, the transistors P3, P4, and P5 each produce less leakage current as a result of this bulk terminal connection. More or less of the PMOS transistors than the transistors P3, P4, and P5 in the circuit 100 could have a bulk connection to the positive supply voltage $V_{DD\_NWL}$ to control leakage current in accordance with an aspect of the invention.

It is to be understood that the example of FIG. 3 is but one example of reducing leakage current of a memory cell 102 and row circuit 104 in the retention mode in accordance with an aspect of the invention. The transistors P6, P7, N8, and N9 need not be specific to one memory cell, but could supply voltage to a number of memory cells in a memory block, including across an entire row, an entire column within a memory block, or to any portion of a memory block, including an entire memory block itself as demonstrated in the example of FIG. 2. Additionally, the above described leakage current reduction methods of switching the voltage potentials of the positive voltage rail 114 and the negative voltage rail 116 of the memory cell 102, removing power to the portion of the row peripheral circuit, and supplying a greater voltage potential to bulk terminals of the P-type transistors need not all be utilized in accordance with an aspect of the invention, but could be used in any combination to reduce leakage current in a memory block that is in the retention mode.

Figure 4:
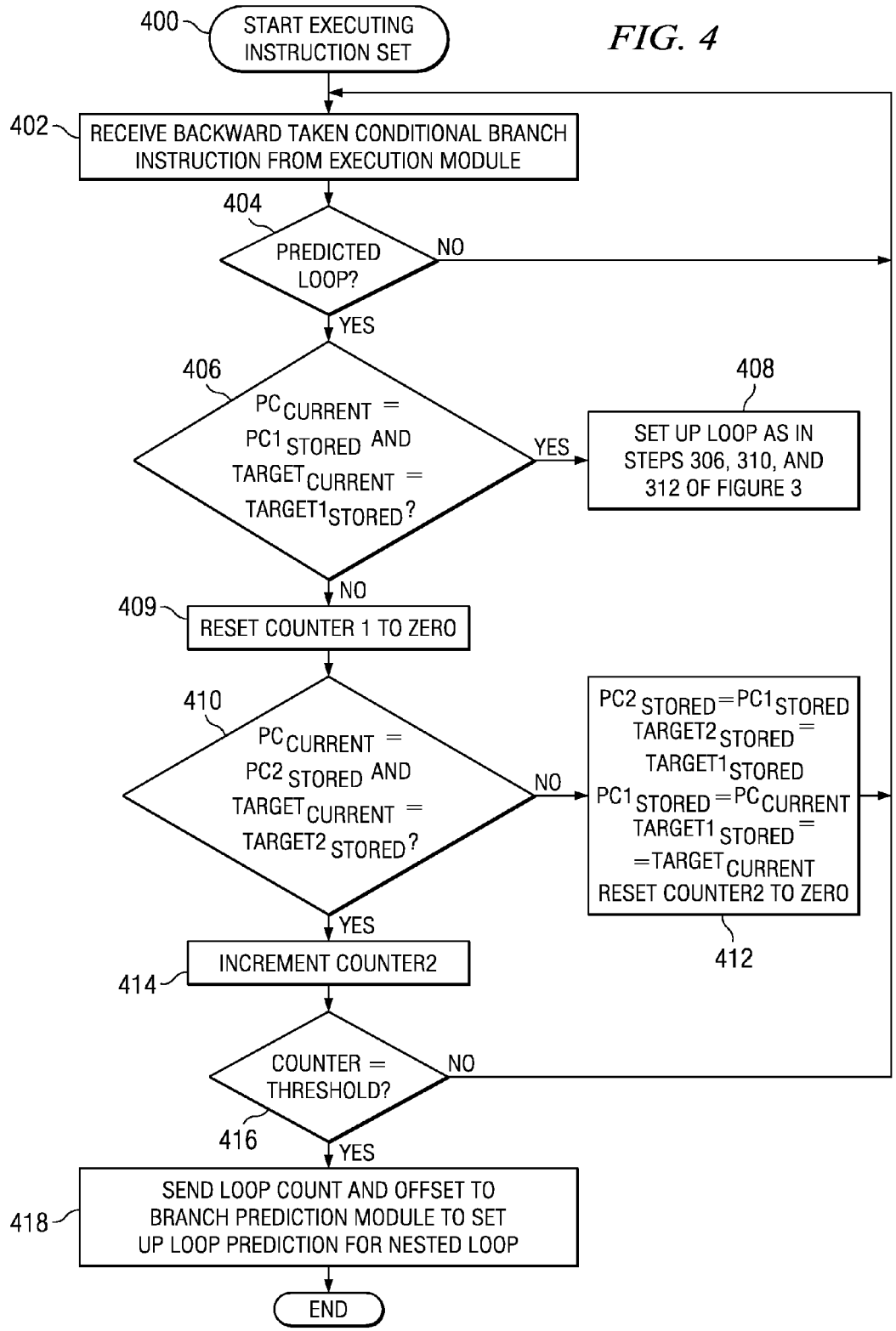
FIG. 4 illustrates a block diagram of a mobile communication device including a memory system in accordance with an aspect of the invention.
Figure 1:
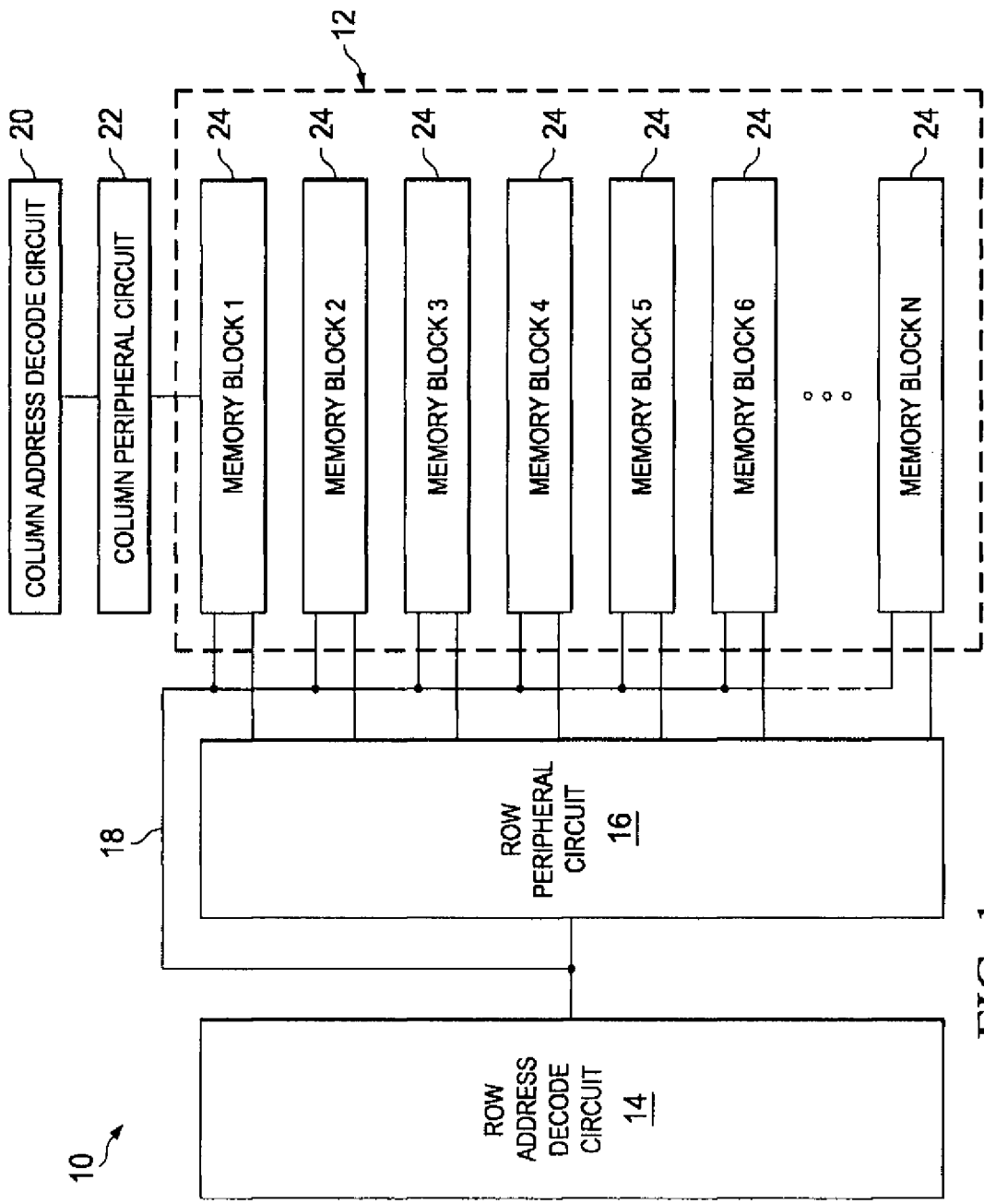
Figure 2:
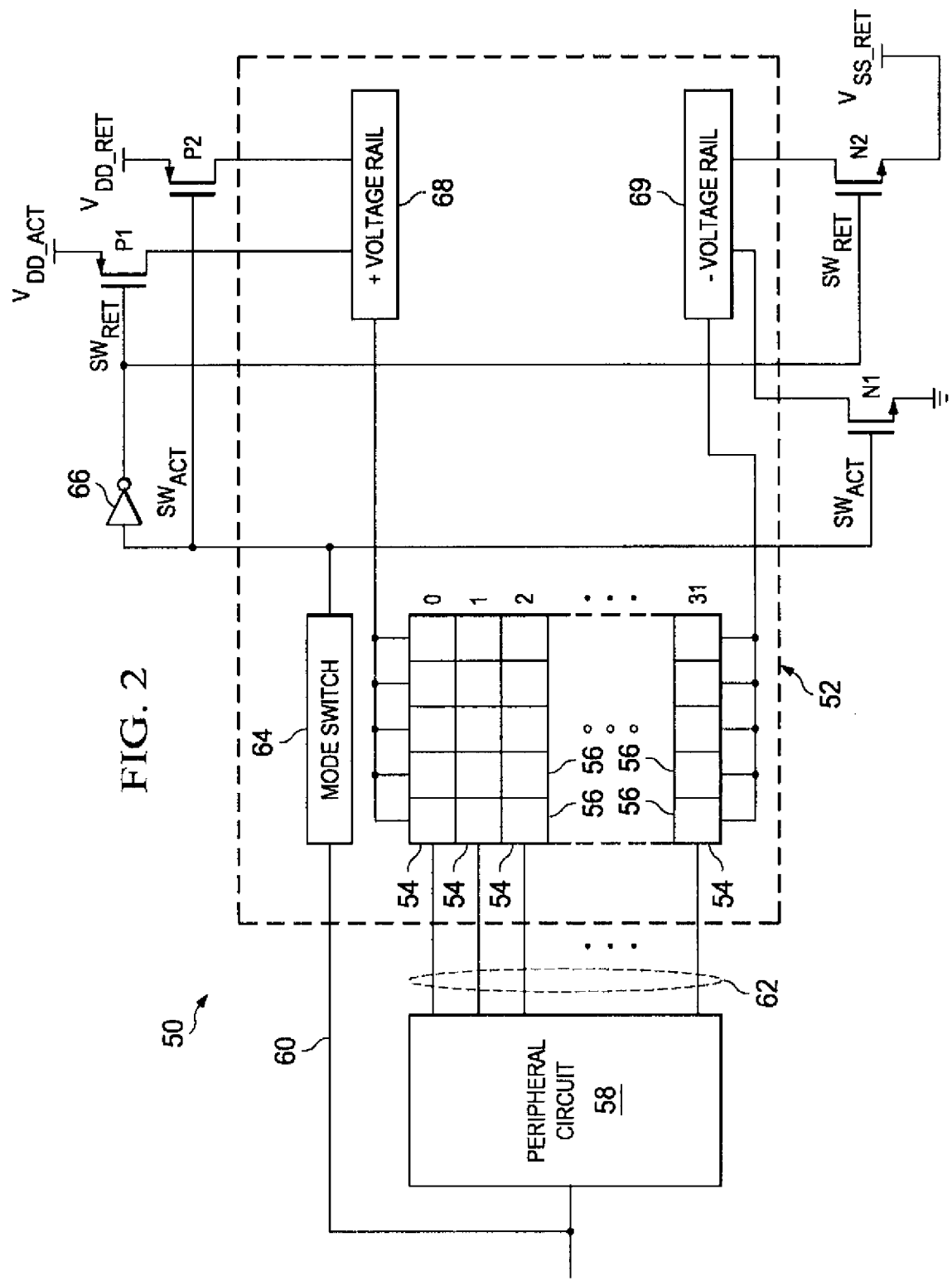
Figure 3:
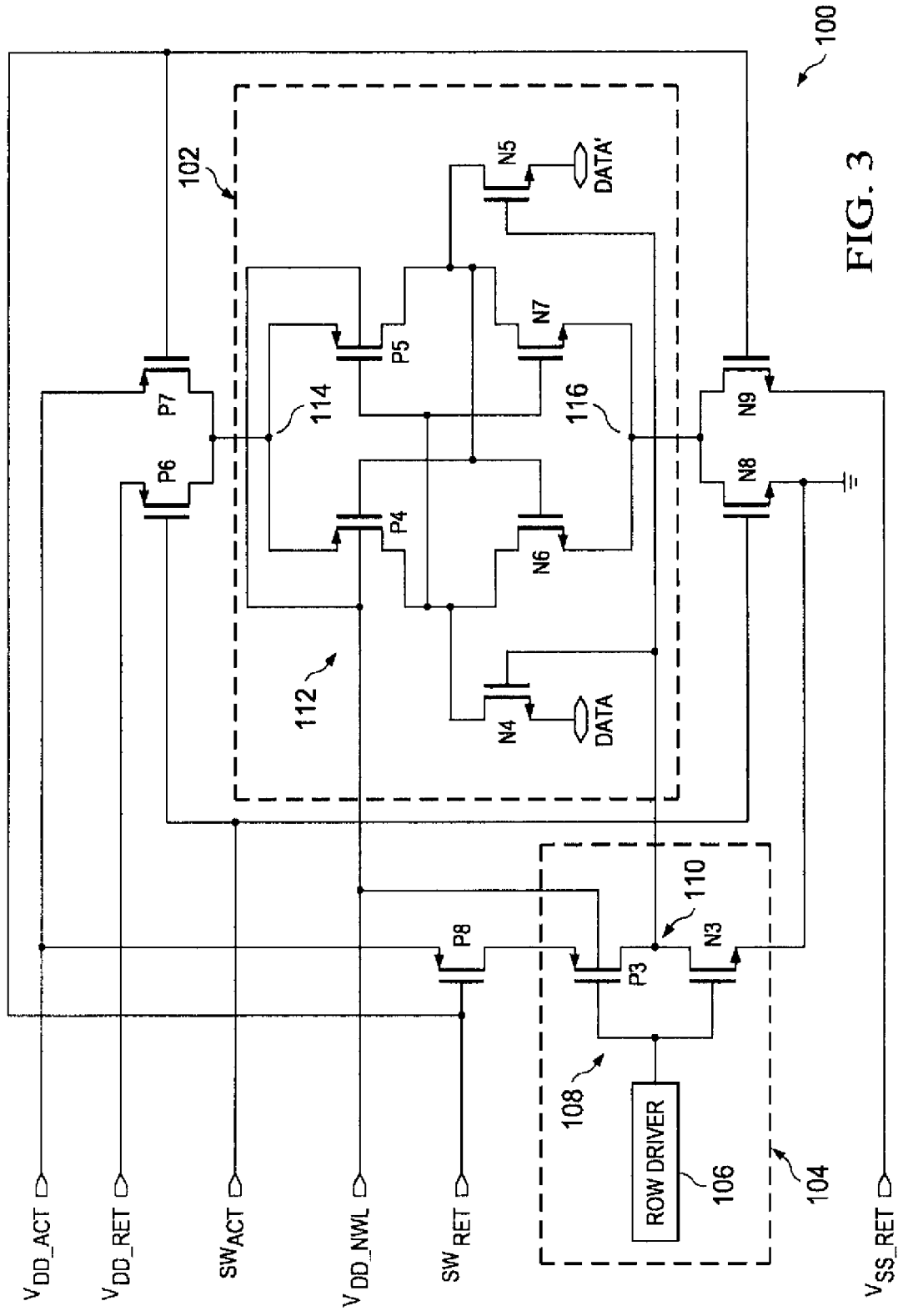
Figure 4:
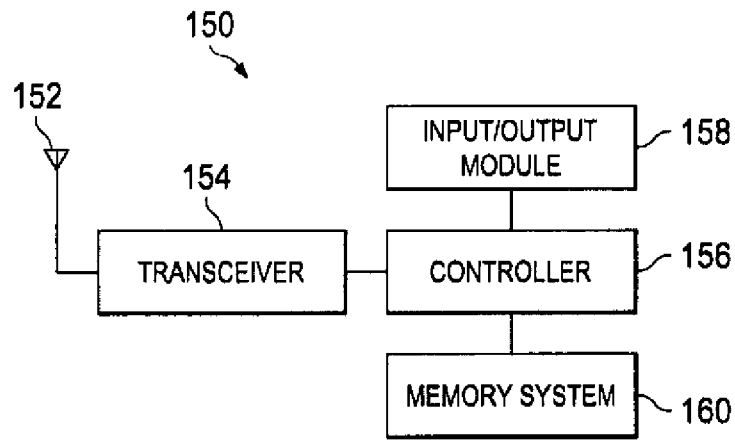
Figure 5:
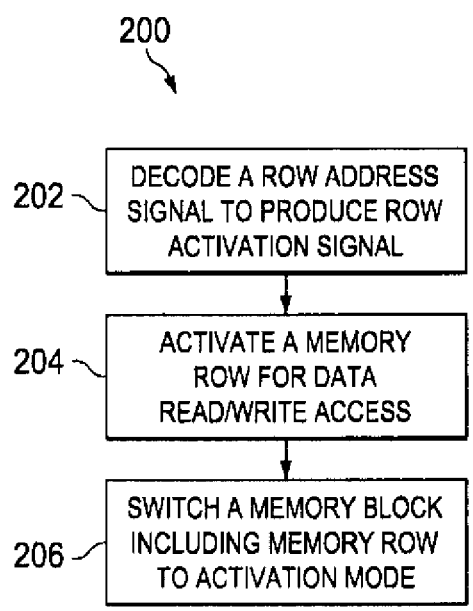

A SRAM that is capable of delivering high performance with reduced leakage current can be utilized in many applications that it is desirable to maintain high-speed and reduced power consumption. An example of such an application is depicted in FIG. 4. FIG. 4 illustrates a mobile communication device (MCD) 150, such as a cellular telephone. Wireless signals are transmitted from and received at an antenna 152. The MCD 150 also includes a transceiver 154, a controller 156, and an input/output module 158, which could include a microphone and receiver. Wireless signals received at the antenna 152 are demodulated at the transceiver 154 and sent to the controller 156, such that the signals can be properly interpreted by the controller 156 as voice data for a user of the MCD 150 at the input/output module 158. Similarly, user voice signals from the input/output module 158 can be sent to the transceiver 154 via the controller 156 to be modulated into a wireless signal that is transmitted from the antenna 152.

The MCD 150 also includes a memory system 160. The memory system could include both volatile and non-volatile memory. The non-volatile memory could include information such as stored phone numbers and digital photographs. The volatile memory, which could include one or more SRAM memory circuits, could be used to store connection information, such as control information between the MCD 150 and a cell tower that is serving the MCD 150. Accordingly, as it is desirous to maintain high performance and reduce power consumption of the MCD, the volatile memory within the memory system 160 could include one or more SRAM circuits in accordance with an aspect of the invention. For example, an SRAM circuit could include a memory array that is divided into multiple memory blocks. A row peripheral circuit could receive a decode signal corresponding to a specific memory row of the memory array. In response, the row peripheral circuit could output a row activation signal to activate the memory row for data read/write access. The decode signal could also switch a memory block that includes the memory row from a retention mode to an activation mode. Alternatively, the memory block could be switched from the retention mode to the activation mode in response to the assertion of the row activation signal for the row that is included within the memory block. The SRAM could thus keep one of the memory blocks in the activation mode with the remainder of the memory blocks kept in the retention mode to reduce leakage current in the SRAM, thus maintaining high performance and conserving power consumption in the MCD.

Figure 5:
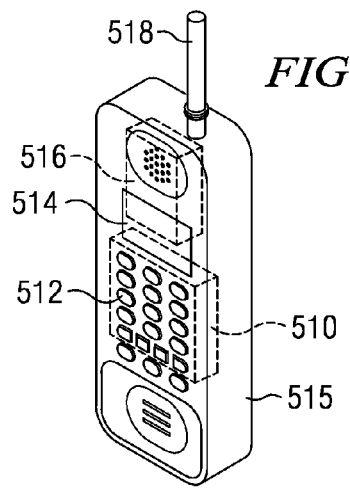
FIG. 5 illustrates a method for reducing leakage current while maintaining high-performance in a memory array circuit in accordance with an aspect of the invention.

In view of the foregoing structural and functional features described above, certain methods will be better appreciated with reference to FIG. 5. It is to be understood and appreciated that the illustrated actions, in other embodiments, may occur in different orders and/or concurrently with other actions. Moreover, not all illustrated features may be required to implement a method.

FIG. 5 demonstrates a method 200 for reducing leakage current and maintaining high performance in a SRAM circuit in accordance with an aspect of the invention. The SRAM could be arranged as a memory array. At 202, a row address signal is decoded to produce a row activation signal. This could occur within a row peripheral circuit. At 204, a memory row corresponding to the row activation signal is activated for data read/write access. The memory rows in the memory array can be organized into separate memory blocks. At 206, a memory block that includes the memory row is switched from a retention mode to an activation mode. The remainder of the memory blocks could remain in the retention mode. The memory block that is in the activation mode has a voltage potential that enables data read/write access to memory cells of the memory rows in the memory block. The memory blocks that are in the retention mode have a reduced voltage, not high enough in magnitude for data read/write access, but sufficient for the storage of data bits in the memory cells of the memory rows in the memory blocks. The memory array thus has reduced leakage current due to a large portion of the memory array being in the retention mode, but is still capable of high performance because at least one of the memory blocks is in the activation mode at a given time.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

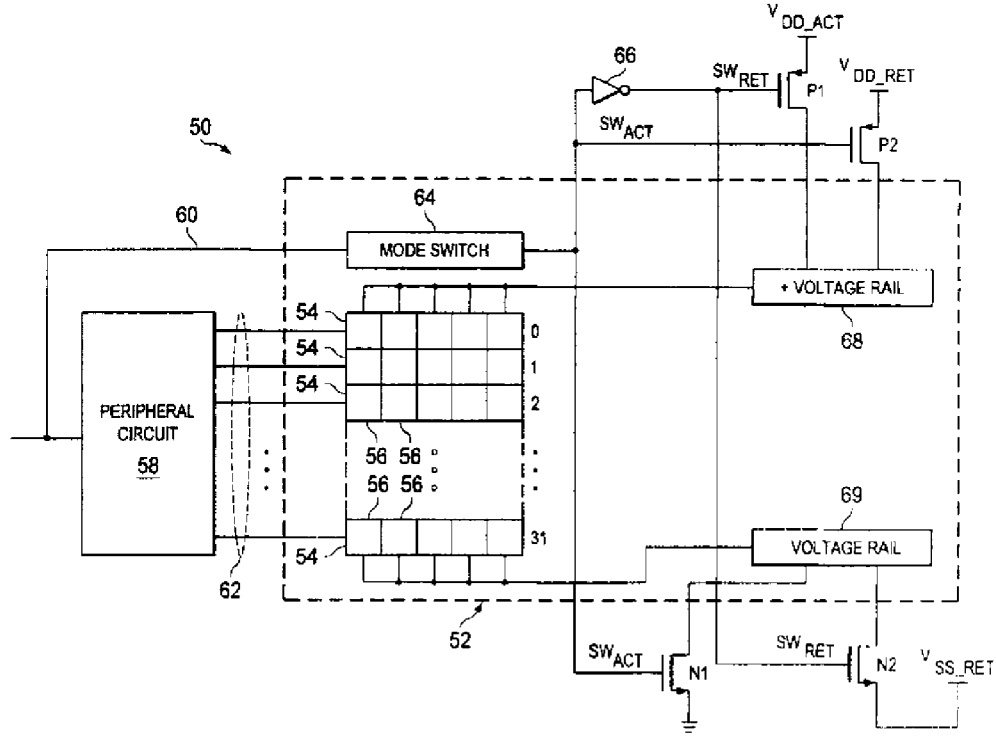

What is claimed is:

1. A memory array system comprising:
   a plurality of memory blocks, each of the plurality of memory blocks having a plurality of memory rows; and
   a mode switch associated with each of the memory blocks configured to switch a respective one of the memory blocks from a retention mode to an activation mode in response to an addressing of a memory row within the respective one of the memory blocks, the activation mode corresponding to the respective one of the memory blocks receiving full power and being capable of having data written to or read from it and the retention mode corresponding to the respective one of the memory blocks receiving reduced power to mitigate leakage current but still being able to retain stored data.

2. The memory array system of claim 1, wherein the respective one of the memory blocks comprises a negative voltage rail that is switched between the first voltage potential in the activation mode and the second voltage potential in the retention mode.

3. The memory array system of claim 2, wherein the respective one of the memory blocks further comprises a positive voltage rail that is switched between a third voltage potential in the activation mode and a fourth voltage potential in the retention mode, the third voltage rail being greater than the fourth voltage potential.

4. The memory array system of claim 1, wherein the mode switch is configured to switch the memory block from the activation mode to the retention mode and to switch a second memory block from the retention mode to the activation mode in response to an addressing of a memory row that is included in the second memory block.

5. The memory array system of claim 1, further comprising a row peripheral circuit configured to assert a row activation signal to address the memory row, and wherein the memory block is switched from the retention mode to the activation mode in response to the assertion of the activation signal.

6. The memory array system of claim 1, further comprising a row peripheral circuit configured to assert a row activation signal to address the memory row, a portion of the row peripheral circuit corresponding to the respective one of the memory blocks comprising a positive voltage rail and at least one switch, the at least one switch configured to disconnect the portion of the row peripheral circuit from the positive voltage rail in response to the memory block being switched from the activation mode to the retention mode.

7. The memory array system of claim 6, wherein each of the plurality of memory blocks and the portion of the row peripheral circuit associated with the respective one of the memory blocks comprises a plurality of P-channel transistors, each of the plurality of P-channel transistors comprising an N-well that is set to a voltage potential that is greater than the positive voltage rail.

8. The memory array system of claim 1, wherein each of the plurality of memory blocks comprises a plurality of memory cells, and wherein each of the plurality of memory cells comprises at least one switch that switches a positive voltage rail associated with the respective one of the memory blocks between a first voltage potential and a second voltage potential in response to the respective one of the memory blocks that comprises the respective plurality of memory cells being switched between the activation mode and the retention mode.

9. The memory array system of claim 1, wherein each of the plurality of memory blocks comprises a plurality of memory cells, and wherein each of the plurality of memory cells comprises at least one switch that switches a negative voltage rail associated with the respective one of the memory blocks between a first voltage potential and a second voltage potential in response to the respective one of the memory blocks that comprises the respective plurality of memory cells being switched between the activation mode and the retention mode.

10. The memory array system of claim 1, wherein at any given time, one of the plurality of memory blocks is in the activation mode and the remaining memory blocks are in the retention mode.

11. A method for reducing leakage current and maintaining high performance in a memory away system comprising a plurality of memory blocks that each comprise a plurality of memory rows, method comprising:
    addressing a first memory row of a first memory block for data read/write access;
    switching the first memory block from a retention mode to an activation mode in response to addressing the first memory row, the activation mode corresponding to the first memory block receiving reduced power to mitigate leakage current but still being able to retain stored data and the activation mode corresponding to the first memory block receiving full power and being capable of having data written to or read from it;
    accessing the first memory row to one of read data from and write data to the first memory row;
    addressing a second memory row of a second memory block for data read/write access; and
    switching the first memory block from the activation mode to the retention mode and switching the second memory block from the retention mode to the activation mode in response to addressing the second memory row.

12. The method of claim 11, wherein the switching the first memory block and switching the second memory block comprises decoding a row address signal and switching the one of the first and second memory blocks between the retention mode and the activation mode in response to the decoded row address signal corresponding to the respective one of the first and second memory row.

13. The method of claim 11, wherein addressing the first memory row and addressing the second memory row comprises:
    generating a row decode signal corresponding to the one of the first and second address rows; and
    decoding the row decode signal to generate a row activation signal;
    wherein accessing the respective one of the first and second memory row comprises accessing the respective one of the first and second memory row in response to the row decode signal, and wherein switching the first memory block and switching the second memory block comprises switching the one of the first memory block and the second memory block in response to the row activation signal.

14. The method of claim 11, wherein at any given time, one of the plurality of memory blocks is in the activation mode and the remaining memory blocks are in the retention mode.

15. The method of claim 11, wherein switching the first memory block and the second memory block from the retention mode to the activation mode comprises switching at least one voltage rail associated with the respective one of the first memory block and the second memory block from a first voltage potential to a second voltage potential, and wherein switching the first memory block from the activation mode to the retention mode comprises switching the at least one voltage rail from the second voltage potential to the first voltage potential, the second voltage potential being greater than the first voltage potential.

16. The method of claim 15, wherein switching the at least one voltage rail comprises switching a negative voltage rail between the first voltage potential and the second voltage potential.

17. The method of claim 16, wherein switching the at least one voltage rail further comprises switching a positive voltage rail between a third voltage potential corresponding to the activation mode and a fourth voltage potential corresponding to the retention mode, the third voltage potential being greater than the fourth voltage potential.

18. The method of claim 11, wherein switching the first memory block from the retention mode to the activation mode comprises connecting a portion of a peripheral circuit associated with the first memory block to a positive voltage rail in response to the memory block being switched from the retention mode to the activation mode.

19. The method of claim 11, further comprising setting an N-well of a plurality of P-channel transistors in the first memory block and a portion of a peripheral circuit associated with the first memory block to a voltage potential that is greater than a positive voltage rail.

20. A mobile communication device comprising:
an antenna for transmitting and receiving wireless signals;
a transceiver; and
a memory array system comprising:
a plurality of memory blocks, each of the plurality of memory blocks having a plurality of memory rows;
a mode switch associated with each of the memory blocks configured to switch a respective one of the memory blocks from a retention mode to an activation mode in response to an addressing of a memory row within the respective one of the memory blocks, the activation mode corresponding to the respective one of the memory blocks receiving full power and being capable of having data written to or read from it and the retention mode corresponding to the respective one of the memory blocks receiving reduced power to mitigate leakage current but still being able to retain stored data.

21. The mobile communication device of claim 20, wherein at any given time, one of the plurality of memory blocks is in the activation mode and the remaining memory blocks are in the retention mode.

22. The mobile communication device of claim 20, wherein the at least one voltage rail comprises a negative voltage rail that is switched between the first voltage potential in the activation mode and the second voltage potential in the retention mode.

23. The mobile communication device of claim 22, wherein the at least one voltage rail further comprises a positive voltage rail that is switched between a third voltage potential in the activation mode and a fourth voltage potential in the retention mode, the third voltage rail being greater than the fourth voltage potential.

24. The mobile communication device of claim 20, wherein the mode switch is configured to switch the memory block from the activation mode to the retention mode and to switch a second memory block from the retention mode to the activation mode in response to an addressing of a memory row that is included in the second memory block.

25. The mobile communication device of claim 20, further comprising a row peripheral circuit configured to assert a row activation signal to address the memory row, and wherein the respective one of the memory blocks is switched from the retention mode to the activation mode in response to the assertion of the activation signal.

26. The mobile communication device of claim 20, further comprising a row peripheral circuit configured to assert a row activation signal to address the memory row, a portion of the row peripheral circuit corresponding to the respective one of the memory blocks comprising a positive voltage rail and at least one switch, the at least one switch configured to disconnect the portion of the row peripheral circuit from the positive voltage rail in response to the respective one of the memory blocks being switched from the activation mode to the retention mode.

27. The mobile communication device of claim 26, wherein each of the plurality of memory blocks and the portion of the row peripheral circuit associated with the respective one of the memory blocks comprises a plurality of P-channel transistors, each of the plurality of P-channel transistors comprising an N-well that is set to a voltage potential that is greater than the positive voltage rail.

28. The mobile communication device of claim 20, wherein each of the plurality of memory blocks comprises a plurality of memory cells, and wherein each of the plurality of memory cells comprises at least one switch that switches a positive voltage rail associated with the respective one of the memory blocks between a first voltage potential and a second voltage potential in response to the respective one of the memory blocks that comprises the respective plurality of memory cells being switched between the activation mode and the retention mode.

29. The mobile communication device of claim 20, wherein each of the plurality of memory blocks comprises a plurality of memory cells, and wherein each of the plurality of memory cells comprises at least one switch that switches a negative voltage rail associated with the respective one of the memory blocks between a first voltage potential and a second voltage potential in response to the respective one of the memory blocks that comprises the respective plurality of memory cells being switched between the activation mode and the retention mode.

* * * * *

UNITED STATES PATENT AND TRADEMARK OFFICE
CERTIFICATE OF CORRECTION

| | | |
|---|---|---|
| PATENT NO. | : 7,489,584 B2 | Page 1 of 6 |
| APPLICATION NO. | : 11/126644 | |
| DATED | : February 10, 2009 | |
| INVENTOR(S) | : Luan A. Dang | |

It is certified that error appears in the above-identified patent and that said Letters Patent is hereby corrected as shown below:

The Title Page, showing an illustrative figure, should be deleted and substitute therefor the attached Title Page.

Delete drawings sheet 1-3 and substitute therefor the drawing sheets, consisting of figs. 1-5 as shown on the attached page.

Signed and Sealed this

Ninth Day of June, 2009

JOHN DOLL
*Acting Director of the United States Patent and Trademark Office*

(12) United States Patent
Dang et al.

(10) Patent No.: US 7,489,584 B2
(45) Date of Patent: Feb. 10, 2009

(54) HIGH PERFORMANCE, LOW-LEAKAGE STATIC RANDOM ACCESS MEMORY (SRAM)

(75) Inventors: Luan A. Dang, Richardson, TX (US); Hiep Van Tran, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/126,644

(22) Filed: May 11, 2005

(65) Prior Publication Data
US 2006/0268648 A1 Nov. 30, 2006

(51) Int. Cl.
G11C 8/00 (2006.01)

(52) U.S. Cl. .............. 365/230.03; 365/230.06; 365/226

(58) Field of Classification Search .............. 365/227, 365/229, 230.03, 230.06, 226, 189.09, 154, 365/156
See application file for complete search history.

(56) References Cited

U.S. PATENT DOCUMENTS

| 3,573,757 | A | * | 4/1971 | Adams | 365/163 |
|---|---|---|---|---|---|
| 5,587,958 | A | * | 12/1996 | Kaneko et al. | 365/230.06 |
| 5,615,162 | A | | 3/1997 | Houston | |
| 5,666,324 | A | | 9/1997 | Kosugi et al. | 365/233 |
| 5,969,995 | A | | 10/1999 | Morishima | |
| 5,991,191 | A | * | 11/1999 | Rao | 365/154 |
| 6,111,779 | A | * | 8/2000 | You | 365/154 |
| 6,850,454 | B2 | * | 2/2005 | Kuge et al. | 365/227 |
| 6,940,754 | B2 | * | 9/2005 | Umezawa | 365/185.09 |
| 7,023,761 | B1 | * | 4/2006 | Tran | 365/233 |
| 7,092,307 | B2 | * | 8/2006 | Chen et al. | 365/226 |

* cited by examiner

Primary Examiner—Gene N. Auduong
(74) Attorney, Agent, or Firm—Ronald O. Neerings; Wade James Brady, Jr.; Frederick J. Telecky, Jr.

(57) ABSTRACT

Systems and methods are provided for reducing leakage current and maintaining high performance in a static random access memory (SRAM). One embodiment discloses a memory array system operative to store data bits in individually addressable rows and columns. The memory array system comprises a plurality of memory blocks, each of the plurality of memory blocks having a plurality of memory rows and a row peripheral circuit operative to switch a memory block from a retention mode to an activation mode in response to an addressing of a memory row within the memory block.

29 Claims, 6 Drawing Sheets